(12) United States Patent
Kim et al.

(10) Patent No.: US 12,374,380 B2
(45) Date of Patent: Jul. 29, 2025

(54) MEMORY MODULE INCLUDING POWER LINE FOR SUPPLYING POWER TO MEMORY DEVICES

(71) Applicant: SK hynix Inc., Icheon-si (KR)

(72) Inventors: Dong Keun Kim, Icheon-si (KR); Min Kang, Icheon-si (KR); Dong Uc Ko, Icheon-si (KR); Young Su Oh, Icheon-si (KR); Hyun Ju Yoon, Icheon-si (KR); Jun Hyun Chun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 354 days.

(21) Appl. No.: 17/859,351

(22) Filed: Jul. 7, 2022

(65) Prior Publication Data

US 2023/0011582 A1 Jan. 12, 2023

(30) Foreign Application Priority Data

Jul. 7, 2021 (KR) .......................... 10-2021-0089146

(51) Int. Cl.
  *G11C 11/4074* (2006.01)
  *G11C 5/14* (2006.01)
  *G11C 11/4099* (2006.01)
(52) U.S. Cl.
  CPC .......... *G11C 11/4074* (2013.01); *G11C 5/145* (2013.01); *G11C 11/4099* (2013.01)

(58) Field of Classification Search
  CPC . G11C 11/4074; G11C 5/145; G11C 11/4099; G11C 5/143; G11C 5/147; G11C 5/04; G11C 5/063; G11C 5/14; G06F 1/3203; H01L 23/5286
  USPC ........................................................ 365/142
  See application file for complete search history.

(56) References Cited

U.S. PATENT DOCUMENTS

| | | | |
|---|---|---|---|
| 10,311,938 B2 | 6/2019 | Dabral | |
| 2008/0284497 A1* | 11/2008 | Kim | ..................... G09G 3/3696 345/212 |
| 2017/0125380 A1* | 5/2017 | Han | ..................... H01L 23/5386 |
| 2019/0006020 A1* | 1/2019 | Sundaresan | ...... G11C 29/12005 |
| 2019/0189182 A1* | 6/2019 | Connolly | ............ G11C 11/4074 |
| 2020/0176348 A1 | 6/2020 | Lim | |
| 2020/0279588 A1* | 9/2020 | Lym | ..................... G11C 29/021 |
| 2021/0373591 A1 | 12/2021 | Hong et al. | |

* cited by examiner

*Primary Examiner* — Alexander Sofocleous
*Assistant Examiner* — James S Wells
(74) *Attorney, Agent, or Firm* — WILLIAM PARK & ASSOCIATES LTD.

(57) ABSTRACT

A memory module includes a module substrate, a plurality of memory devices, a first power line, and a second power line. The memory devices are mounted on the module substrate. Each of the memory devices includes a power management member. The first power line may be arranged in the module substrate to provide each of the memory devices with power. The second power line may be electrically connected between the power management members of adjacent memory devices to control and share the power provided to the adjacent memory devices.

17 Claims, 7 Drawing Sheets

MEMORY MODULE INCLUDING POWER LINE FOR SUPPLYING POWER TO MEMORY DEVICES

CROSS-REFERENCES TO RELATED APPLICATION

The present application claims priority under 35 U.S.C. § 119(a) to Korean application number 10-2021-0089146, filed on Jul. 7, 2021, in the Korean Intellectual Property Office, which is incorporated herein by reference in its entirety.

BACKGROUND

1. Technical Field

Various embodiments may generally relate to a memory module, and more particularly, to a memory module including a module substrate with a power control line.

2. Related Art

Currently, a dual in-line memory module (DIMM) may include a plurality of packages and a power management integrated circuit (hereinafter, PMIC), Each of the plurality of packages may include at least one memory chip, as a DRAM device. The PMIC should be placed in an appropriate area of the memory module to supply uniform power to the plurality of packages.

However, due to differences of distances between the PMIC and each of the packages and performance differences between the plurality of the packages, it is difficult to uniformly provide the power to the plurality of the packages.

SUMMARY

In an embodiment of the present disclosure, a memory module may include a module substrate, a plurality of memory devices, a first power line and a second power line. The plurality of memory devices are mounted on the module substrate. Each of the memory devices include a power management member to control power. The first power line is embedded in the module substrate. The first power line provides power to the memory devices arranged in the module substrate. The second power line is embedded in the module substrate and electrically connected between the power management members of two or more memory devices among the plurality of memory devices. The memory devices including the power management members connected by the second power line share the power and at least one internal voltage generated based on the power.

In an embodiment of the present disclosure, a memory module may include a module substrate and "n" number of packages. The module substrate may include a power transmission line and a power control line. The packages may be mounted on at least one surface of the module substrate. The packages may be commonly connected with the power transmission line. Each of the packages may include at least one memory chip and a power control chip. The power control chip may generate and manage at least one internal voltage for driving the memory chip. The power control line may electrically connect the power control chips of a number "m" (n>m) of adjacent packages with each other to commonly control and share the internal voltages of the m number of packages.

In an embodiment of the present disclosure, a memory module may include a module substrate, a plurality of packages, and at least one power control line. The module substrate may have a first surface and a second surface. The module substrate may include a power transmission line configured to provide a power voltage from an external device. The packages may be mounted on at least one of the first surface and the second surface of the module substrate. Each of the packages may include a power control chip configured to receive a power voltage from the power transmission line to control a memory chip in the package. The power control line may be arranged in the module substrate. The power control line may be electrically isolated from the power transmission line. The power control line may electrically connect the power control chips of adjacent first to third packages to share the power voltage applied to the first to third packages and an internal voltage generated based on the power voltage.

According to example embodiments, memory devices on a module substrate may share power with each other. A memory device may receive power, which may be required for operating the memory device, from an adjacent memory device. Because the memory device may receive the power from the adjacent memory device, the power may be rapidly supplied and the power may be effectively managed.

BRIEF DESCRIPTION OF THE DRAWINGS

The above and other aspects, features, and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present teachings are described herein with reference to a limited number of cross-section and/or plan illustrations of example embodiments. However, possible embodiments of the present teachings should not be construed as being limited the presented embodiments. It will be appreciated by those of ordinary skill in the art that changes may be made in the presented embodiments without departing from the principles and spirit of the present teachings as defined by the appended claims.

Figure 1:
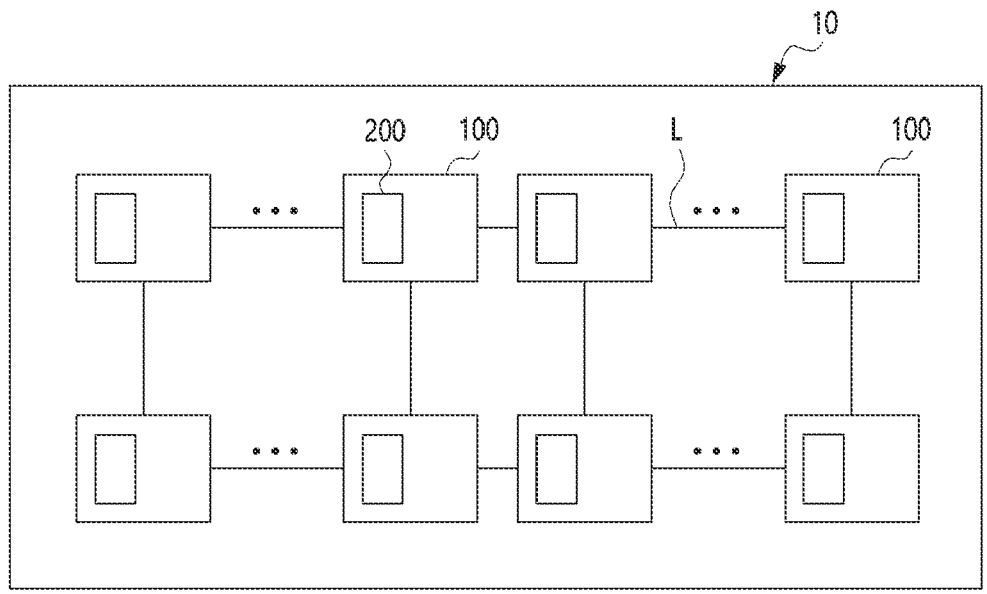
FIG. 1 is a view illustrating a memory module substrate on which a memory device including a power management member is mounted in accordance with example embodiments.

FIG. 1 is a view illustrating a memory module substrate on which a memory device including a power management member is mounted in accordance with example embodiments.

Referring to FIG. 1, a plurality of memory devices 100 may be mounted on a memory module substrate 10, The memory module substrate 10 may provide a computing device with storage space for main memory. The memory devices 100 on the memory module substrate 10 may include DRAM, PRAM, FRAM, MRAM, etc.

Each of the memory devices 100 may include a power management member 200. The power management member 200 may function as a power management integrated circuit (PMIC). The power management member 200 may transmit power supplied through an external power supply or a battery to regions of the memory device 100 on the memory module substrate 10.

The power management member 200 may manage an amount of power consumed by operations of the memory device 100. For example, the power management member 200 may process a power profile command corresponding to each of the operations in the memory device 100 to generate a power consumption profile in accordance with a time flow with respect to each of the operations. The power management member 200 may sum up the power consumption amount by unit time with respect to the operation. The power management member 200 may manage a summed power consumption amount within a predetermined power range.

Therefore, the power management members 200 may manage the power of the memory devices 100 to effectively use the power. For example, each power management member 200 may manage power for a corresponding memory device. A necessary amount of the power may be changed in accordance with the operations of the memory devices 100.

Figure 2:
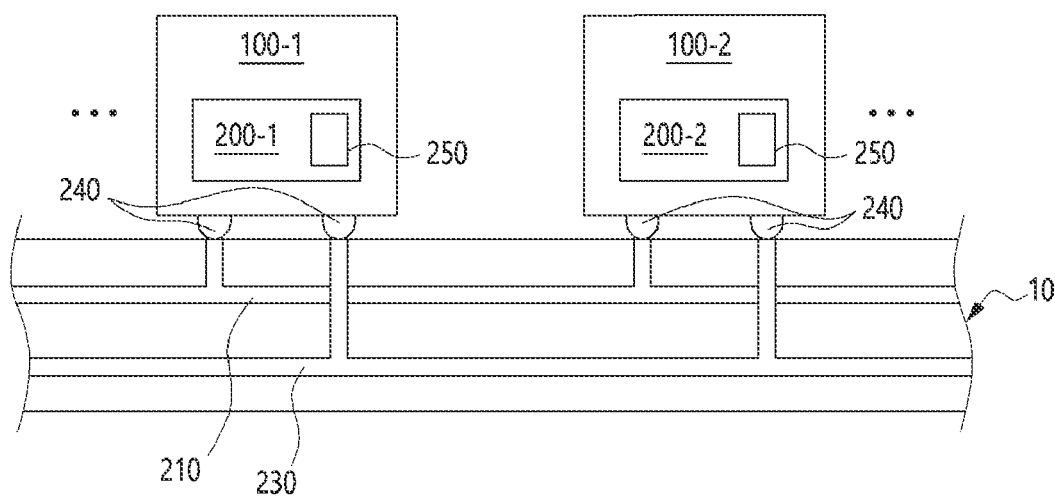
FIG. 2 is a view illustrating a memory module substrate on which a memory device including a power management member is mounted in accordance with example embodiments.

Each of the memory devices 100 may be electrically connected with each other through a connection line L of the memory module substrate 10, FIG. 2 is a view illustrating a memory module substrate on which a memory device including a power management member is mounted in accordance with example embodiments.

Referring to FIG. 2, memory devices 1004 and 100-2 may include power management members 2004 and 200-2. The power management members 200-1 and 200-2 may be positioned in the memory devices 1004 and 100-2, respectively. The memory module substrate 10 may include a first power line 210 and a second power line 230. The first power line 210 may be connected between the memory devices 1004 and 100-2 and an external power supply (not shown). The second power line 230 may be connected between the power management members 200-1 and 200-2 in the memory devices 100-1 and 100-2.

The first power line 210 may be electrically connected to the memory devices 100-1 and 100-2 through at least one external connection member 240 such as a conductive ball in FIG. 2. Similar, the second power line 230 may be connected to the power management members 200-1 and 200-2 through at least one external connection member 240. Alternatively, the external connection member 240 may include another element configured to attach the memory devices 100-1 and 100-2 to the memory module substrate 10 such as a pad, a pin, a slot, etc. The power management members 200-1 and 200-2 may share a power with each other through the second power line 230.

The amount of power shared through the first power line 210 may be greater or less than the amount of power shared through the second power line 230. The power supplied to the memory devices 100-1 and 100-2 through the first power line 210 connected to the external power supply may be used as a driving voltage source power of the power management members 200-1 and 200-2 in the memory devices 100-1 and 100-2.

In example embodiments, the first memory device 100-1 may receive power from the external power supply (not shown). An "operation A" may be inputted into the first memory device 100-1. An amount of power a' may be required for performing the operation A of the first memory device 100-1. The first power management member 200-1 in the first memory device 100-1 may receive the requirement of the amount of power a' for performing the operation A of the first memory device 100-1, The first power management member 200-1 may provide the first memory device 100-1 with the amount of power a'.

When the amount of power needed for the operation A is high, the amount of power shared with the first memory device 100-1 through the external power supply may be less than a' and therefore insufficient power to perform the operation A.

The first memory device 100-1 may receive additional power to meet the requirement a' for performing the operation A from the second memory device 100-2 adjacent to the first memory device 100-1. The first power management member 200-1 in the first memory device 100-1 and the second power management member 200-2 in the second memory device 100-2 may be connected with each other through the second power line 230. Thus, the needed power may be transmitted between the first power management member 200-1 and the second power management member 200-2 through the second power line 230. Further, because the second memory device 100-2 may be adjacent to the first memory device 100-1, the power required for the operation A may be supplied to the first memory device 100-1 from the second memory device 100-2.

Each of the power management members 200-1 and 200-2 may include a measurement unit 250, Each of the measurement units 250 may measure the amount of power supplied from the power management members 200-1 and 200-2 in the memory devices 100-1 and 100-2, When the measurement units 250 determine the amount of the power supplied to the memory devices 100-1 and 100-2 to be insufficient, the power management members 200-1 and 200-2 in the adjacent memory devices 100-1 and 100-2 may share power with each other through the second power line 230.

Figure 3:
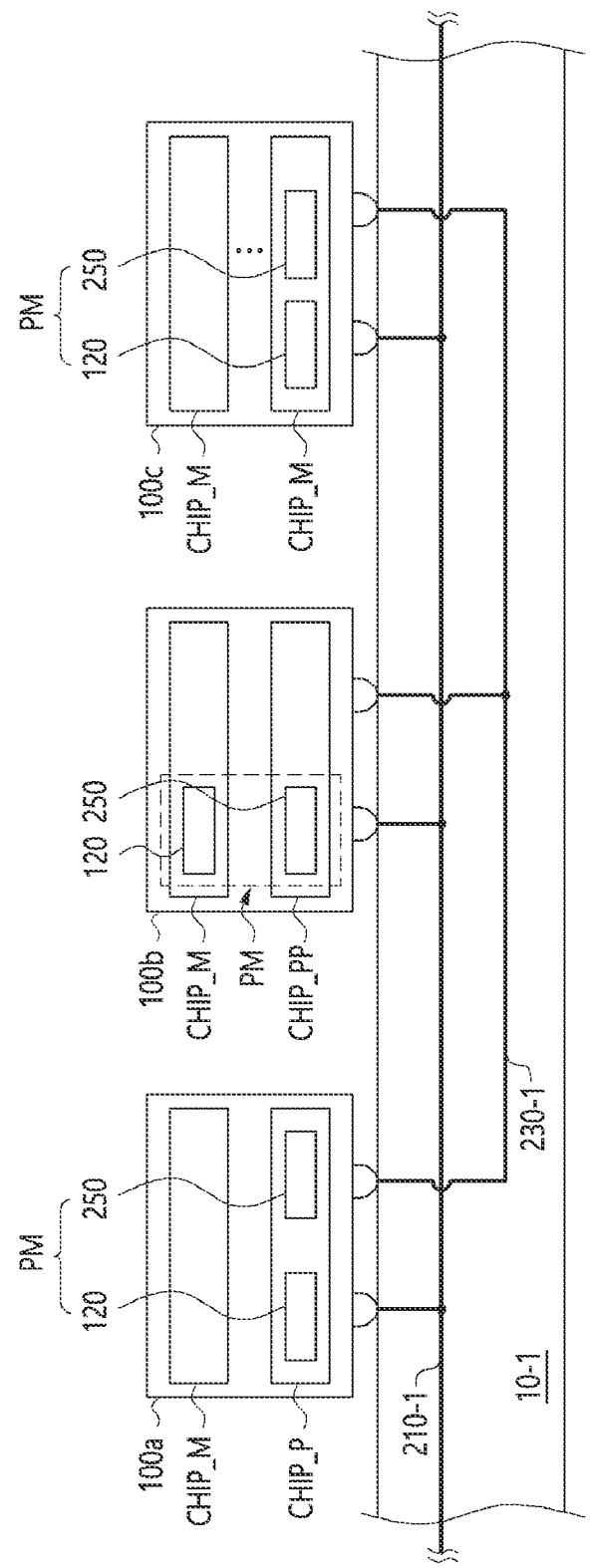
FIG. 3 is a view illustrating a memory module substrate on which a memory device including a power management member is mounted in accordance with example embodiments.

FIG. 3 is a view illustrating a memory module substrate on which a memory device including a power management member is mounted in accordance with example embodiments.

Referring to FIG. 3, a plurality of memory devices 100a, 100b and 100c may be mounted on a memory module substrate 10-1. Each of the memory devices 100a, 100b, 100c may include at least one memory chip CHIP_M. Further, each of the memory devices 100a, 100b and 100c may include an internal voltage generator 120 and a measurement unit 250 as a power management member PM.

In example embodiments, the memory device 100a may include at least one memory chip CHIP_M and a power chip CHIP_P. The power chip CHIP_P may include the internal voltage generator 120 and the measurement unit 250 as the power management member PM.

In another example embodiments, the memory device 100b may include at least one memory chip CHIP_M including the internal voltage generator 120 and the power chip CHIP_P including the measurement unit 250. Although, the internal voltage generator 120 and the measurement unit 250 may be placed on different chips, the internal voltage generator 120 and the measurement unit 250 may be interfaced with each other and driven as the power management member PM.

In another example embodiments, the memory device 100c may include at least one memory chip CHIP_M. At least on memory chip CHIP_M may include the internal voltage generator 120 and the measurement unit 250. For example the internal voltage generator 120 and the measurement unit 250 may be embedded in the same memory chip CHIP_M. Alternately, the internal voltage generator 120 and the measurement unit 250 may be embedded in different memory chips CHIP_M.

The memory devices 100a, 100b and 100c as well as other memory devices mounted on the module substrate 10-1 may be supplied with external power through a first power line 210-1. For example, the internal voltage generator 120 and the measurement unit 250 may control the external power provided through the first power line 210-1 and the internal voltages generated from the external power of the memory device 100a, 100b or 100c in which the internal voltage generator 120 and the measurement unit 250 are embedded.

The internal voltage generator 120 of the memory devices 100a, 100b and 100c may be connected with each other through a second power line 230-1. The internal voltage generator 120 in the memory devices 100a, 100b and 100c may be connected with each other through the second power line 230-1 to share power with each other.

The internal voltage generator 120 that generates at least one internal voltage for driving the memory devices 100a, 100b and 100c may be built into the memory devices 100a, 100b and 100c. The memory devices 100a, 100b and 100c may receive different operational commands to perform operations. The power consumed by the semiconductor memory device 100a, 100b and 100c may be different according to the operational command. For example, one memory device 100a, 100b or 100c may receive a command for an operation requiring more power than the one memory device 100a, 100b or 100c is able to supply on its own. Because the one memory device 100a, 100b or 100c is incapable of meeting its own power needs, the memory device 100a, 100b or 100c may not perform the operation.

For an embodiment of the present teachings, a memory device 100a, 100b or 100c performing an operation needing more power than the memory device 100a, 100b or 100c can provide on its own may receive power from an adjacent memory device 100a, 100b or 100c. A measurement unit 250 in the memory device 100a, 100b or 100c may measure the power supplied to the memory device 100a, 100b or 100c. When the measurement unit 250 determines that the power in the memory device 100a, 100b or 100c is insufficient for performing the operation, the memory device 100a, 100b or 100c performing the operation may receive power from the adjacent memory device 100a, 100b or 100c. The memory device 100a, 100b or 100c performing the operation and the adjacent memory device 100a, 100b or 100c may be connected with each other via the second power line 230-1 to share power with each other.

Adjacent memory devices 100a, 100b or 100c may share power through the second power line 230-1. Thus, when it is required to perform an operation using a relatively high amount of power, the memory device 100a, 100b or 100c may be provided with the relatively high amount of the power, from the adjacent memory devices 100a, 100b and 100c, that may be generated or provided.

According to the example embodiments, the power management member PM may be configured to generate the internal voltages using the external power. Further, the power management member PM may determine whether to share the power of the adjacent memory device based on a level of external power, operation modes of the memory devices, and a usage time of the memory devices 100a, 100b and 100c.

Figure 4:
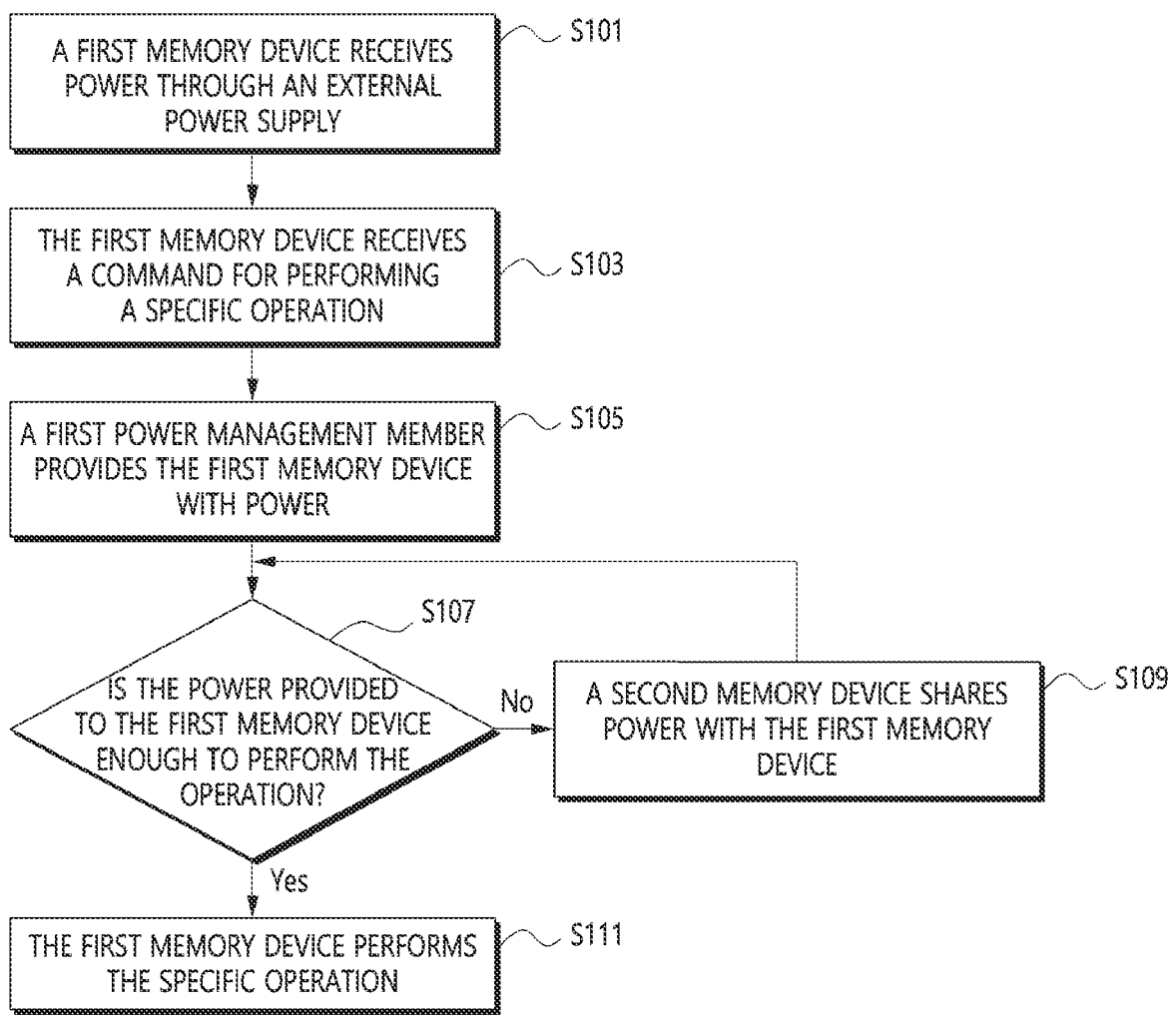
FIG. 4 is a flow chart illustrating an order for sharing power between memory devices in accordance with example embodiments.

FIG. 4 is a flow chart illustrating an order for sharing power between memory devices in accordance with example embodiments.

In order to share the power between the memory devices in FIG. 4, the memory devices may be mounted on the memory module substrate in FIG. 2 or FIG. 3. As described in FIG. 2 and FIG. 3, the power management member or the internal voltage generator may be provided in the memory devices. The memory devices may be connected to the external power supply through the first power line. The power management members or the internal voltage generators in the memory devices may be connected with each other through the second power line.

In step S101, the first memory device may receive power from the external power supply through the first power line.

In step S103, the first memory device may receive a command for performing a specific operation. The specific operation may include a read operation, a write operation, a refresh operation, etc., but is not limited thereto.

In step S105, the first power management member in the first memory device may supply power for performing the operation to the first memory device.

In step S107, the first measurement member may measure the amount of power supplied to the first memory device. The first measurement member may then compare the measured amount of power with a reference amount of power needed for performing the operation.

When the amount of power provided to the first memory device is less than the reference amount of power, in step S109, the first memory device may receive additional power for performing the operation from the second power management member in the second memory device. When the first memory device is unable to source enough power to perform an assigned operation, it is able to source additional power from another memory device, such as a neighboring memory device. In this way, the memory device may complete the operation by receiving power to perform the operation from multiple sources.

After the first memory device receive the additional power from the second power management member in the adjacent second memory device, in step S107, the first measurement member may then compare the currently measured amount of power with the reference amount of power needed for performing the operation.

When the currently measured amount of power in the first memory device falls short of the reference amount of power needed to perform the operation, the first memory device may receive additional power for performing the operation from an nth memory device. The first memory device may repeatedly receive power for performing the operation from the nth memory device. That is, when the first memory device may require additional power for performing the operation, the first memory device may receive the necessary power from the adjacent memory devices.

In contrast, when the amount of power available to the first memory device without receiving additional power from other memory devices is equal to or greater than the reference amount of power, in step S111, the first memory device may perform the operation without sourcing additional power from the other memory devices.

The power management member in the memory device may rapidly supply the power required for performing the operation to the memory device as compared to conventional power management IC, Because the conventional power management IC controls all of the memory devices mounted on the memory module substrate, a power supply speed and a feedback speed for the satisfaction of the power may be differentiated in accordance with a distance between the conventional power management IC and the memory device.

For example, the power management IC have provided all of the memory device with the necessary power. However, the power management IC slowly receive the feedback for the satisfaction of the power, that is, a result of whether proper power has been transmitted to the memory device, as a distance between the memory device from the power management IC, Thus, the power management IC may provide different power for performing a different operation to the memory devices 100, before the power management IC has received all of the feedback from the memory devices Thus, unnecessary power may be provided in accordance with the distance between the power management IC and the memory device so that the power may be ineffectively managed.

In contrast, according to example embodiments, each of the memory devices 100 may include a power management member 200 or an internal voltage generator. Thus, when an amount of power available to the memory device 100 is insufficient, the memory device 100 may receive additional power from the power management member 200 or the internal power supply in at least one adjacent memory device 100.

As a result, the necessary power may be more rapidly supplied to the corresponding memory device 100, Particularly, when the memory device 100 may require a relatively large amount of power, the power management member 200 in the adjacent memory device 100 may effectively respond.

Figure 5:
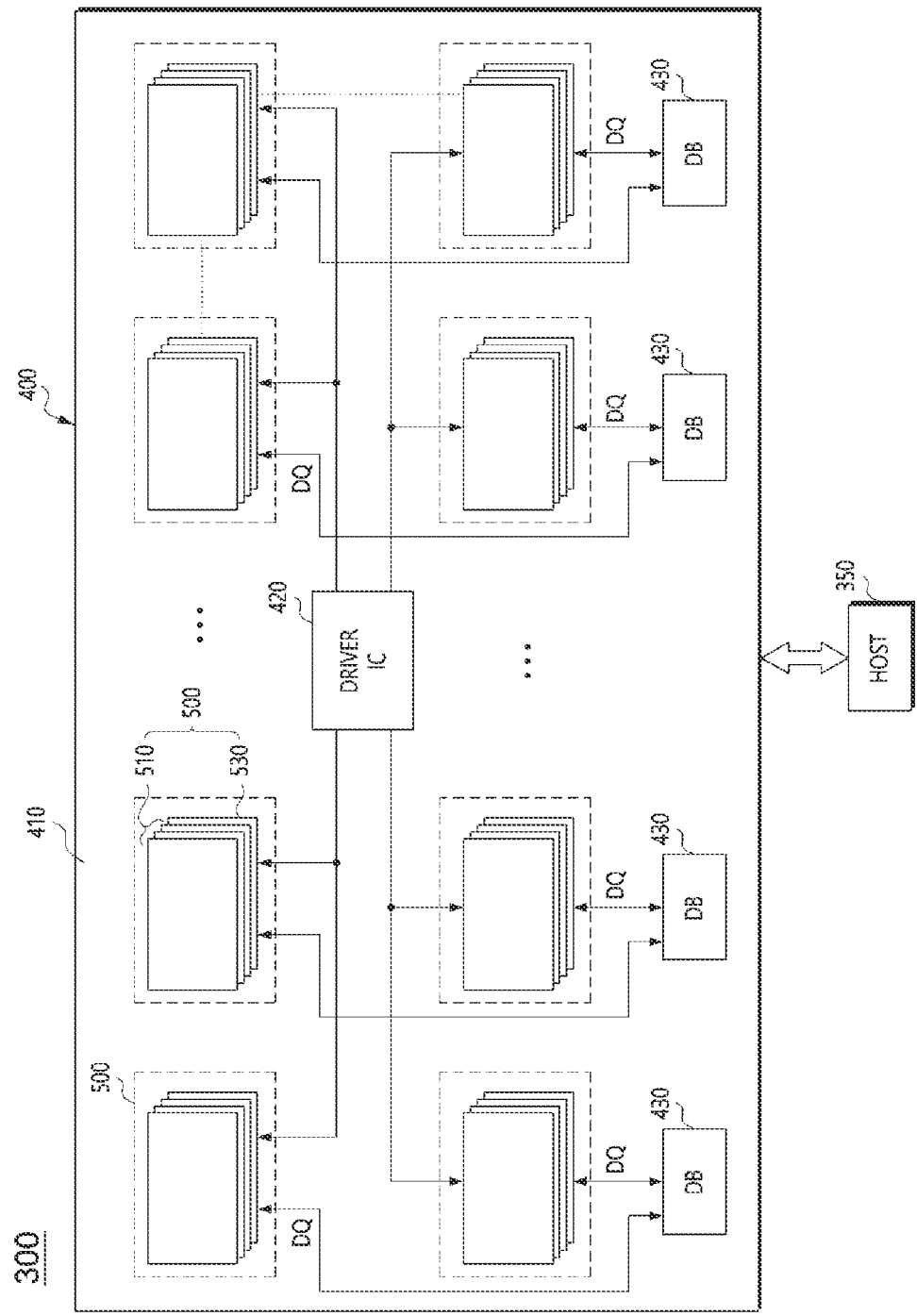
FIG. 5 is a block diagram illustrating a semiconductor system in accordance with example embodiments.
Figure 6:
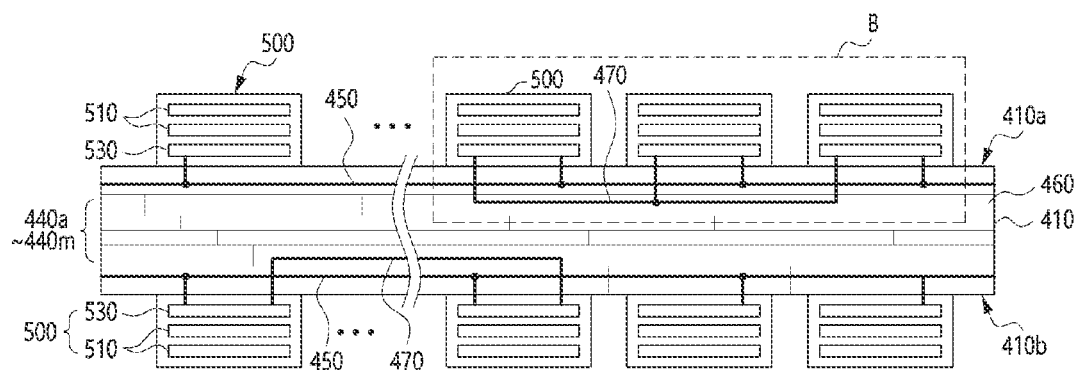
FIG. 6 is a cross-sectional view illustrating a memory module in accordance with example embodiments.

FIG. 5 is a block diagram illustrating a semiconductor system in accordance with example embodiments and FIG. 6 is a cross-sectional view illustrating a memory module in accordance with example embodiments.

Referring to FIGS. 5 and 6, a semiconductor system 300 may include a host 350 and a memory module 400.

The host 350 may include a master device configured to control the memory module 400. The memory module 400 may include a slave device configured to perform various operations requested by the host 350, The host 350 may provide the memory module 400 with various signals, such as a request, a command, an address signal, data, etc., for controlling the memory module 400. The host 350 may include a CPU, a graphic processing unit (GPU), a multimedia processor (MMP), a digital signal processor, etc. Further, the host 350 may include a system-on-chip formed by combining processor chips having various functions such as an application processor (AP) with each other. The host 350 may include a memory controller.

The memory module 400 may include a module substrate 410 and a plurality of packages 500. The packages 500 may include at least one memory chip 510. The memory chip 510 may include DRAM, PCRAM, FRAM, MRAM, flash memory, etc. The package 500 may include a plurality of the same kind or different kinds of memory chips 510.

Further, each of the plurality of packages 500 may further include a power control chip 530 for controlling a power voltage and driving voltages of the memory chip 510.

In example embodiments, a selected power control chip 530 in a selected package 500 may control and manage a power voltage of at least one memory chip 510 included in the selected package 500 as well as a power voltage of at least one memory chip 510 of adjacent packages 500 located near the selected package 500.

Figure 9:
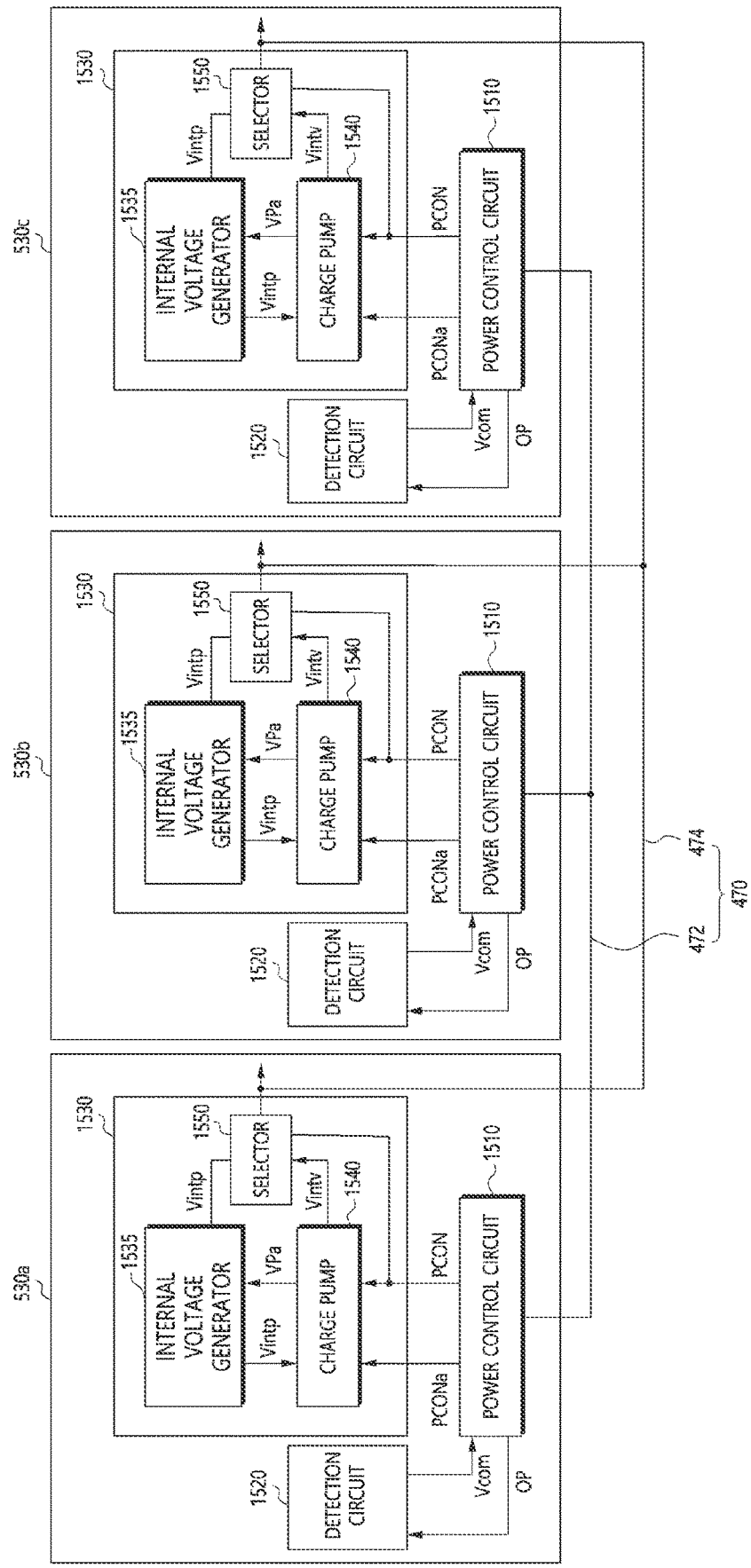
FIG. 9 is a block diagram illustrating operations of a memory module having shared packages including a predetermined number of packages which have different operation times in accordance with example embodiments.

Because the power control chip 530 may be included in each of the plurality of packages 500, the power control chip 530 may have a compact size compared to a conventional PMIC on a module substrate 410 to control all of the plurality of packages. The power control chip 530 of some example embodiments is illustrated in FIG. 9.

The memory module 400 may further include a driver IC 420 and a plurality of data buffers (DB) 430 for controlling the plurality of packages 500. Various ICs (not shown) as well as the driver IC 420 and the data buffers 430 may be mounted on the module substrate 410 with the plurality of packages 500.

The driver IC 420 may receive a command, an address signal and a clock signal from the host 350. The driver IC 420 may provide the packages 500 with the drive signal, the address signal and the clock signal using a connecting line L.

The data buffers 430 may buffer the data received from the host 350. The data buffers 430 may provide the packages 500 with the buffered data signal DQ.

The module substrate 410 may have a first surface 410a and a second surface 410b opposite to the first surface 410a, The packages 500 may be mounted on at least one of the first surface 410a and the second surface 410b of the module substrate 410 using at least one external terminal 240 in FIG. 2.

The module substrate 410 may include a plurality of signal lines 440a~440m for transmitting the drive signal, the address signal, the dock signal and the data signal DQ, The plurality of signal lines 440a~440m may directly or indirectly connected to the connecting line L. For example, the signal lines 440a~440m for transmitting different signals may be electrically isolated from each other. In contrast, the signal line 440a~440m for transmitting a same signal may be electrically connected with each other through at least one via contact (not shown).

The module substrate 410 may include a power transmission line 450 and a power control line 470. The power transmission line 450 and the power control line 470 may be embedded in the module substrate 410.

The power transmission line 450 may transmit the power voltage provided from outside of the module substrate 410 to the all packages 500 on the module substrate 410.

The power control line 470 may be configured to connect a predetermined number of packages 500 among all the packages 500 with each other. Hereinafter, the predetermined number of packages connected by one power control line will be referred to as "shared packages". For example, the power control line 470 may be connected between the power control chips 530 of the shared packages 500, Thus, the shared packages 500 connected by the power control line 470 may share the power voltage as well as at least one internal voltage generated based on the power voltage through the power control line 470.

Figure 7:
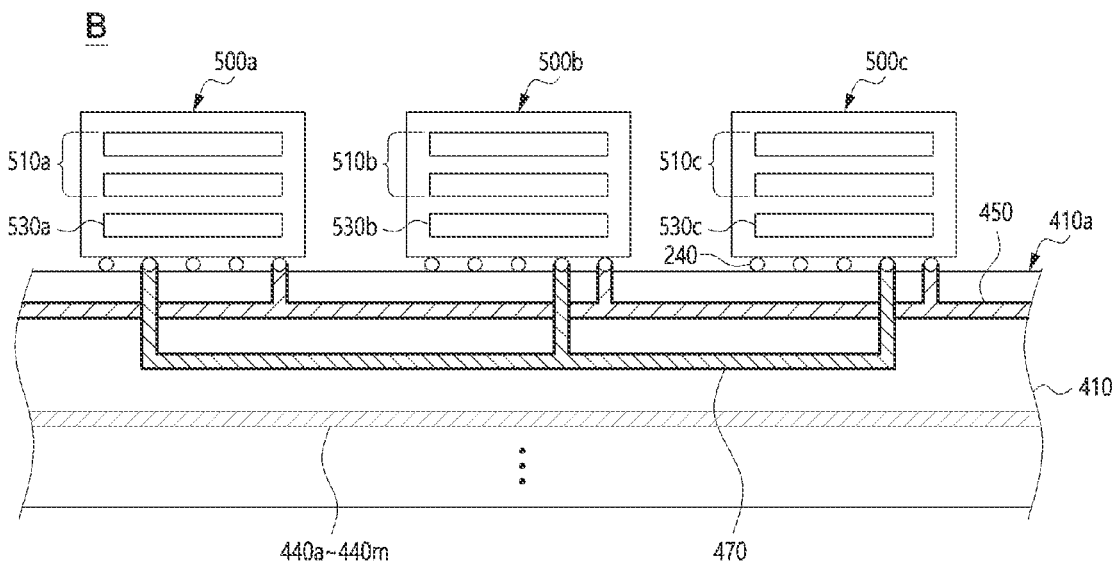
FIG. 7 is an enlarged cross-sectional view of a portion "B" in FIG. 6.

FIG. 7 is an enlarged cross-sectional view of a portion "B" in FIG. 6.

Referring to FIG. 7, a first package 500a, a second package 500b, and a third package 500c may include a first power control chip 530a, a second power control chip 530b, and a third power control chip 530c, respectively. The first to third power control chips 530a-530c may be electrically connected through the power control line 470, Thus, the first to third power control chips 530a-530c may correspond to the above shared packages.

The power transmission line 450 may transmit the power voltage to the first to third packages 500a-500c as well as other packages mounted on the module substrate 410. In other words, the plurality of packages 500 mounted on the module substrate 410 may receive the power voltage through the power transmission line 450, Thus, the first to third power control chips 530a, 530b, and 530c of the first to third packages 500a, 500b, and 500c may receive the power voltage through the power transmission line 450, In example embodiments, the power transmission line 450 and the power control line 470 may be electrically isolated from each other using an insulating layer 460.

Figure 8:
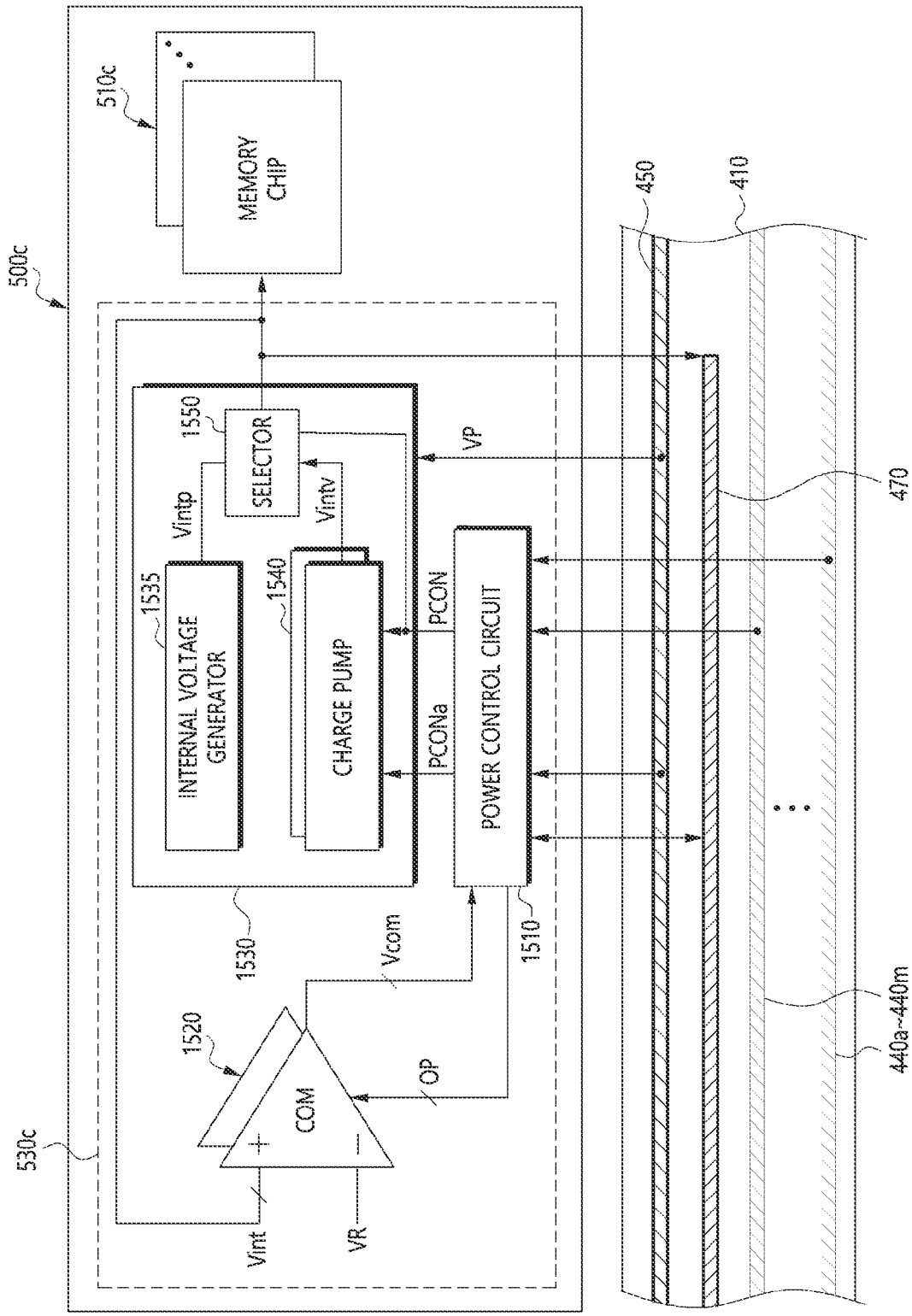
FIG. 8 is a detailed block diagram illustrating the third power control chip of FIG. 7.

FIG. 8 is a detailed block diagram illustrating the third power control chip 530c of FIG. 7.

Referring to FIG. 8, each of the power control chips 530a, 530b, and 530c may include a power control circuit 1510, a detection circuit 1520, and a voltage generation circuit 1530.

The power control circuit 1510 may receive the power voltage through the power transmission line 450, The power control circuit 1510 may receive the drive signal, the address signal, and/or the data through the signal lines 440a~440m (refer to FIG. 6). The power control circuit 1510 may receive the power voltage VP by the power transmission line 450. The power control circuit 1510 may receive information to the power voltage or the power of the shared packages 500a, 500b, and 500c through the power control line 470, The power control circuit 1510 may output a drive control signal OP that is a signal for driving the detection circuit 1520. The drive control signal OP may be generated when verifications with respect to output signals of the voltage generation circuit 1530 (hereinafter, referred to as internal voltages) may be required.

In example embodiments, the power control circuit 1510 may further include a power determiner (not shown) configured to compare the power voltage VP and a reference power voltage. The power determiner may include a conventional comparison circuit. When the power voltage VP transmitted through the power transmission line 450 is lower than the reference power voltage, the power control circuit 1510 may generate a voltage boost control signal PCONa to boost the power voltage VP so that a level of the power voltage is substantially same with a level of the reference power voltage.

The detection circuit 1520 may be driven in response to the drive control signal OP. The detection circuit 1520 may compare the internal voltage Vint generated from the voltage generation circuit 1530 with a reference voltage VR of the internal voltage Vint. When the internal voltage Vint be different from the reference voltage VR, that is, when the internal voltage Vint is not more than the reference voltage VR, the detection circuit 1520 may output an enabled comparison signal Vcom. For example, the detection circuit 1520 may include at least one comparison circuit COM. For example, the number of the comparison circuits COM may correspond to the number of internal voltages Vint generated in the voltage generation circuit 1530. Thus, when the internal voltage(s) does not reach a target voltage level (that is, a level of the reference voltage VR), the detection circuit 1520 may enable the comparison signal Vcom. The comparison signal Vcom may be inputted to the power control circuit 1510. The power control circuit 1510 may generate a voltage boost control signal PCON based on the enabled comparison signal Vcom.

In an example embodiment, the detection circuit 1520 may correspond to the measurement unit in the previous example embodiment.

The voltage generation circuit 1530 may include at least one internal voltage generator 1535, at least one charge pump 1540 and at least one selector 1550. The voltage generation circuit 1530 may receive the power voltage VP from the power transmission line 450 through the power control circuit 1510.

The internal voltage generator 1535 may receive the power voltage VP as a drive voltage thereof. The internal voltage generator 1535 may generate various levels of preliminary internal voltages Vintp for driving the memory chip 510c based on the power voltage VP. In example embodiments, the internal voltage generator 1535 may include conventional internal voltage generators having various configurations used in a semiconductor integrated circuit field.

The charge pump 1540 may boost the power voltage VP to the reference power voltage in response to the voltage boost control signal PCONa, thereby generating a corrected power voltage. Further, the charge pump 1540 may provide the corrected power voltage to the internal voltage generator 1535 as the drive voltage thereof.

Further, the charge pump 1540 may boost the preliminary internal voltage(s) Vintp of the internal voltage generator 1535 to the reference voltage(s) VR in response to the voltage boost control signal PCON. The charge pump 1540 may then provide the selector 1550 with a boosted internal voltage Vintv.

In an example embodiment, the charge pump 1540 may include a conventional voltage boost circuit configured to boost a level of an input voltage. An example of the charge pump 1540 is disclosed in U.S. Patent Publication No. 2021/0373591, which is incorporated herein by reference in its entirety.

The selector 1550 may provide the memory chip 510c with a selected one of the preliminary internal voltage Vintp and the boosted internal voltage Vintv in response to the voltage boost control signal PCON. For example, when the voltage boost control signal PCON is enabled, the selector 1550 may output the boosted internal voltage Vintv. When the voltage boost control signal PCON is disabled, the selector 1550 may output the preliminary internal voltage Vintp as the internal voltage of the voltage generation circuit 1530.

FIG. 9 is a block diagram illustrating operations of a memory module having shared packages including a predetermined number of packages which have different operation times in accordance with example embodiments. In FIG. 9, a case in which the shared package includes a first to third packages will be described as an example.

Referring to FIG. 9, the power control line 470 may include a plurality of power control lines. In example embodiments, the power control line 470 may include a first power control line 472 and a second power control line 474.

The first power control line 472 may be connected between the power control circuits 1510 of the first to third power control chips 530a, 530b, and 530c of the first to third packages. Thus, the voltage boost control signals PCONa and PCON of the power control circuits 1510 in the first to third power control chips 530a, 530b, and 530c may be shared by the first power control line 472. The charge pumps 1540 of the first to third power control chips 530a, 530b, and 530c may be simultaneously driven by sharing the voltage boost control signals PCONa and PCON through the first power control line 472. Thus, the power voltage VP and/or the internal voltage Vint of the shared packages may be rapidly boosted (or corrected) by simultaneously driving the charge pumps 1540 of the shared packages.

The second power control line 474 may be connected between output terminals of the voltage generation circuit 1530 in the first to third power control chips 530a, 530b, and 530c. Thus, the internal voltages Vint of the first to third power control chips 530a, 530b and 530c may be shared with each other by the second power control line 474.

Referring to FIGS. 7 to 9, the first to third packages 500a, 500b, and 500c constituting the shared package may have different operation speeds. For example, when the operation speed of the second package 500b is longer than the operation speeds of the first and third packages 500a and 500c, performances of the circuits 1510~1550 in the power control chip 530b of the second package 500b may be deteriorated more than performances of the circuits 1510~1550 of the power control chips 530a and 530c in the first and third packages 500a and 500c. However, because the first and third packages 500a and 500c may be connected with the power control line 470 together with the second package 500b, although the performance of the second package 500b may be relatively deteriorated, a correction speed (or boosting speed) of the power voltage VP and/or the internal voltage Vint of the second package 500b may be compensated by a drive force of the first and third packages 500a and 500c and the operation speeds of the circuits.

Although at least one of a level of the power voltage VP and a level of the internal voltage(s) in the first to third packages 500a, 500b, and 500c is varied, when the first to third packages 500a, 500b, and 500c constituting the shared packages have the same performance, the charge pumps 1540 of the first to third packages 500a, 500b, and 500c may be simultaneously driven. Thus, the power voltage and the internal voltage are rapidly corrected (boosted) by the second power control line 474.

That is, the first to third packages 500a, 500b, and 500c have different operation times, and most rapidly corrected power voltage and most rapidly corrected internal voltage among the first to third packages 500a, 500b, and 500c, are shared with the first to third packages through the power control line 474.

The above-described embodiments of the present disclosure are intended to illustrate but not to limit the present teachings. Various alternatives and equivalents are possible. The present teachings are not limited by the embodiments described herein. Nor are the present teachings limited to any specific type of semiconductor device. Other additions, subtractions, and/or modifications are possible in view of the present disclosure and are intended to fall within the scope of the appended claims.

What is claimed is:

1. A memory module comprising:
a module substrate;
a plurality of memory devices mounted on the module substrate, each of the memory devices individually including a memory chip and a power control chip;
a first power line embedded in the module substrate to provide power to the plurality of memory devices; and
a second power line embedded in the module substrate and electrically connected between the power control chips of at least two memory devices among the plurality of memory devices,
wherein the memory devices including the power control chips connected by the second power line share the power, and
wherein the memory devices have different operation times, and most rapidly corrected power voltage and most rapidly corrected internal voltage among the memory devices are shared with the memory devices through the first and second power lines.

2. The memory module of claim 1, wherein the power control chip comprises a measurement unit that determines whether the power transmitted by the first power line is enough to perform an operation corresponding to a command inputted into the memory device.

3. The memory module of claim 1, wherein the first power line and the second power line are electrically isolated from each other.

4. The memory module of claim 1, wherein the power control chip generates at least one internal voltage for driving the memory device based on the power, and
the memory devices including the power control chips connected by the second power line share the internal voltage.

5. A memory module, comprising:
a module substrate including a power transmission line and a power control line which are embedded in the module substrate; and
"n" number of packages mounted on at least one surface of the module substrate, the packages receive a power voltage through the power transmission line,
wherein each of the packages individually comprises a memory chip and a power control chip configured to generate and manage at least one internal voltage for driving the memory chip, the internal voltage generated based on the power voltage,
wherein the power control line is electrically connected between the power control chips of "m" number of packages among the n numbers of packages, the m number of packages are arranged adjacent to each other, and the power voltages and the internal voltages of the m number of packages are controlled and shared by the power control line in common,
wherein "n" and "m" are natural numbers and "m" is less than "n", and
wherein the packages have different operation times, and most rapidly corrected power voltage and most rapidly corrected internal voltage among the packages are shared with the packages through the power control line.

6. The memory module of claim 5, wherein the power control chip comprises:

a power control circuit receiving the power voltage provided from the power transmission line to output a drive control signal and a voltage boost control signal;

a voltage generation circuit receiving the power voltage and the voltage boost control signal to generate the internal voltage; and a detection circuit configured to compare the internal voltage with a reference voltage based on the drive control signal, and output a comparison result to the power control circuit.

7. The memory module of claim 6, wherein the voltage generation circuit comprises:

an internal voltage generator configured to generate the internal voltage based on the power voltage; and at least one charge pump configured to boost at least one of the power voltage and the internal voltage in response to the voltage boost control signal.

8. The memory module of claim 7, wherein the voltage boost control signal comprises a first voltage boost control signal generated when the power voltage is different from a reference power voltage and a second voltage boost control signal generated when the comparison result of the detection circuit is enabled.

9. The memory module of claim 8, wherein the charge pump is configured to boost the power voltage to a level of the reference power voltage in response to the first voltage boost control signal to generate a corrected power voltage, and the charge pump is configured to output the corrected power voltage as a drive voltage of the internal voltage generator.

10. The memory module of claim 8, wherein the charge pump boosts an output signal of the internal voltage generator to a level of the reference voltage in response to the second voltage boost control signal to generate a corrected internal voltage.

11. The memory module of claim 10, wherein the voltage generation circuit further comprises a selector configured to output a selected one of an output signal of the internal voltage generator and the corrected internal voltage in response to the second voltage boost control signal.

12. The memory module of claim 11, wherein the power control line comprises:

a first power control line configured to transmit the voltage boost control signal which is enabled, and to activate the charge pumps of the m number of packages, when the voltage boost control signal from any one of the m number of packages is enabled; and a second power control line connected with output terminals of the voltage generation circuits in the m number of packages, in common.

13. The memory module of claim 5, wherein the module substrate further comprises at least one signal transmission line configured to transmit at least one driving signal, a clock signal, an address, and data to the n number of packages.

14. A memory module comprising:

a module substrate having a first surface and a second surface, the module substrate including a power transmission line configured to receive a power voltage from outside the memory module;

a plurality of packages mounted on at least one of the first and second surfaces of the module substrate, each of the packages including at least one memory chip and a power control chip receiving the power voltage through the power transmission line, controlling and managing the power voltage and at least one voltage for driving the memory chip in each of the packages; and at least one power control line embedded in the module substrate and electrically isolated from the power transmission line, wherein a first to a third power control chips of a first to a third packages among the plurality of packages are electrically connected by the power control line, and the power voltage provided to the first to third packages and internal voltages generated at the first to third power control chips are shared by the power control line, wherein the first to third packages have different operation times, and most rapidly corrected power voltage and most rapidly corrected internal voltage among the first to third packages are shared with the first to third packages through the power control line.

15. The memory module of claim 14, wherein the power control chip comprises:

a power control circuit receiving the power voltage provided through the power transmission line to generate a power voltage boost control signal based on a level of the power voltage, an internal voltage boost control signal based on a level of the internal voltage, and a drive control signal;

a voltage generation circuit including at least one internal voltage generator configured to generate at least one preliminary internal voltage for driving the memory chip based on the power voltage, at least one charge pump configured to boost at least one of the power voltage and the preliminary internal voltage in response to at least one of the power voltage boost control signal and the internal voltage boost control signal to output a corrected power voltage and a corrected internal voltage, and a selector configured to output selected one of the preliminary internal voltage and the corrected internal voltage in response to the internal voltage boost control signal; and a detection circuit configured to compare the internal voltage with a reference voltage based on the drive control signal, and output a comparison result to the power control circuit.

16. The memory module of claim 15, wherein the power control line comprises:

a first power control line connected with the power control circuits of the first to third packages to share at least one of the power voltage boost control signal and the internal voltage boost control signal with each other; and a second power control line configured to share the output signals of the selectors in the first to third packages with each other.

17. The memory module of claim 1, wherein the memory device includes a package in which the memory chip and the power control chip are stacked.

* * * * *